United States Patent [19]

Corwin et al.

[11] 4,320,250
[45] Mar. 16, 1982

[54] ELECTRODES FOR CONCENTRATOR SOLAR CELLS, AND METHODS FOR MANUFACTURE THEREOF

[75] Inventors: Rudolph E. Corwin, Seattle; Dietrich E. Riemer, Auburn; Billy J. Stanbery, Seattle, all of Wash.

[73] Assignee: The Boeing Company, Seattle, Wash.

[21] Appl. No.: 169,756

[22] Filed: Jul. 17, 1980

[51] Int. Cl.³ .................. H01L 31/04; H01L 31/18
[52] U.S. Cl. .................. 136/256; 29/572; 136/255; 204/15; 357/30; 357/68; 357/71
[58] Field of Search .................. 204/15; 136/256, 255; 29/572; 357/30, 65, 67, 68, 71

[56] References Cited

U.S. PATENT DOCUMENTS 4,131,488  12/1978  Lesk et al. .................. 148/1.5
4,227,940  10/1980  Ling et al. .................. 136/256
4,227,941  10/1980  Bozler et al. .................. 136/255

OTHER PUBLICATIONS

D. P. Tanner et al., "An All-Plated, Low Cost Contact System for Silicon Solar Cells", *Conf. Record, 14th IEEE Photovoltaic Specialists Conf.* (1980), pp. 800–804.
K. Lui et al., "Electroformed Aluminum–Contact Solar Cells", *Conf. Record, IEEE Photovoltaic Specialists Conf.*, (1970), pp. 62–69.

Primary Examiner—Aaron Weisstuch
Attorney, Agent, or Firm—Hughes, Barnard & Cassidy

[57] ABSTRACT

An improved light transducer such as a solar cell and, especially, a concentrator solar cell, together with processes for forming the same which permit the formation of light transducers characterized by their improved efficiency, especially, at concentration ratios on the order of 100 Suns and greater; and, more particularly, an improved process for forming concentrator solar cell electrodes, and improved concentrator solar cells produced thereby, characterized in that the electrodes comprise a multiplicity of closely spaced, fine-line—i.e., preferably on the order of less than about 1.0 mils in width—electroplated electrodes which are on the order of at least as thick as they are wide and, preferably which are at least 0.7 mils in thickness yet, which are characterized by their relatively sharp, vertical edge profiles and which are essentially devoid of lateral "spread" of the electroplated electrode materials.

21 Claims, 9 Drawing Figures

ELECTRODES FOR CONCENTRATOR SOLAR CELLS, AND METHODS FOR MANUFACTURE THEREOF

RELATED APPLICATION

Billy J. Stanbery, Ser. No. 169,790 filed July 17, 1980, for "Light Transducers Such As Solar Cells and Concentrator Solar Cells, And Methods For Manufacture Thereof."

BACKGROUND OF THE INVENTION

The present invention relates generally to solar cells and/or other light-to-electrical energy transducers; and, more particularly, to solar cells—especially, concentrator solar cells—and to methods of manufacture thereof, characterized in that the cells have a multiplicity of closely spaced, fine-line—e.g., on the order of less than about 1.0 mils and, preferably, less than about 0.7 mils—electrodes formed on the surface thereof by a process wherein successive thin layers of, for example, titanium, palladium (each on the order of 500 Å in thickness), and silver (on the order of 1000 Å in thickness) are first deposited on the contact areas of the cell by means of a conventional vacuum deposition process and, thereafter, the thickness of the fine-line electrodes is significantly increased to a thickness at least as great as the width of the fine-lines and, preferably, to at least on the order of 0.7 mils, by an electroplating process (preferably using a silver cyanide plating process) while employing a relatively thick exposed and developed photoresist mask so as to form electrodes which, despite having a thickness at least as great as the width thereof and, preferably, at least 0.7 mils, or greater, nevertheless are characterized by their sharp vertical edge profiles and which are essentially devoid of lateral "spreading," a phenomenon commonly encountered with conventional electroplating processes and which tends to mask the photoactive cell regions on either side of the fine-line electrodes, thereby reducing cell efficiency.

One of the more perplexing problems faced by designers, manufacturers and users of light-to-electrical energy transducers such as solar cells and concentrator solar cells has, for a number of years, been the need to improve both the light energy collection efficiency and the conversion efficiency of light-to-electrical energy transducers. In this connection, it has long been recognized that light reflected from the face of a solar cell is a principal source of poor light collection efficiency, and many efforts have been made, and are continuing to be made, to solve this problem. Initially, such efforts were primarily directed towards providing a thin, non-reflective, transparent barrier layer; but, such non-reflective barrier layers, of and by themselves, have not provided a satisfactory solution to the problems. More recently, it has been proposed that the photoactive regions of the photocell substrate be "texturized" by the use of a texturizing etchant so as to form a surface characterized by randomly located irregularities (commonly pyramidal in shape) defining light absorptive surfaces having reflecting facets to increase collection efficiency. Those interested in a more detailed description of the foregoing problems and solutions thereto are referred to the aforesaid co-pending application of Billy J. Stanbery, Ser. No. 169,790 filed July 17, 1980, and assigned to the assignee of the present invention.

The rapidly advancing state of the technology relating to concentrator solar cells and the like which has led to attainment of ever increasing light collection efficiencies and light-to-electrical energy conversion efficiencies has increased the demand for reliable and effective solar cell electrode arrangements characterized by their ability to effectively collect the increased electrical current generated in such cells. Of course, one apparent way to improve the current conduction capacities of solar cells is simply to increase the surface area of the electrodes formed on the cells; but, conversely, increasing the surface area of that portion of the cell which is covered by electrode materials also serves to reduce the photoactive surface area of the cell, thereby reducing both light collection efficiency and light-to-electrical energy conversion efficiency.

Various techniques have been used and are well-known in the art for forming electrodes on the surface of a solar cell. These include, merely by way of example, conventional vacuum deposition techniques, ion sputtering techniques and/or electroplating techniques. Generally, however, the formation of electrodes with the use of vacuum deposition techniques and/or ion sputtering techniques is limited to the application of relatively thin electrodes which are commonly measured in angstroms (Å). Electroplating techniques, on the other hand, permit the application of considerably thicker electrodes. Unfortunately, however, electroplated electrodes tend to spread laterally as the thickness of the electrode increases; and, typically, such electroplated lines tend to spread to a width on the order of twice the thickness of the electroplated electrode. For example, where one is attempting to form an electrode on the order of 1.0 mils in thickness, a conventional electroplating process tends to actually produce an electrode which is on the order of 2.0 mils in width. With concentrator solar cells of the type here under consideration, it is desirable that the electrodes have an extremely fine-line geometry, on the order of less than about 1.0 mils and, preferably, less than about 0.7 mils in width; and, consequently, when one attempts to form such fine-line electrodes with thicknesses of up to, for example, 0.7 mils to 1.0 mils in thickness, the "spreading" phenomenon actually produces a resultant electrode which will range from approximately 1.5 mils in width to 2.0 mils or greater—i.e., thereby representing a significant increase in the area of the photocell which is effectively masked by electrode materials by an amount on the order of from 300% to 500%. This, of course, results in a significant reduction of photoactive material which can be exposed to incident radiation.

As indicated above, the prior art is replete with a wide range of techniques for applying electrodes to the contact areas of light transducers. One early disclosure is that contained in Falkenthal U.S. Pat. No. 2,034,334 which describes a very primitive method for applying electrodes. Subsequently, electrodes have generally been applied in the form of grid lines in the manner disclosed in Hansell U.S. Pat. No. 2,310,365 and in Ross et al. U.S. Pat. No. 3,411,952.

Iles et al. U.S. Pat. No. 3,361,594 represents an early patent disclosure wherein a contact pattern is formed on the upper surface of the cell either by the use of a conventional printing process or by the use of a suitable photoresist mask. The cell is then etched with hydrofluoric acid or the like to form openings in the photoresist mask or the like which are subsequently filled with metal to form relatively thin electrodes.

King U.S. Pat. No. 4,086,102 discloses a process in which the surface of the cell is masked and an ion beam sputtering process is employed to form relatively thin electrodes through the mask. Revesz et al. U.S. Pat. No. 3,904,453 employs a photoresist mask and etching techniques to remove metallic and oxide layers from the substrate beneath the developed openings in the mask. Thereafter, a thin metal film is deposited through the openings in the mask to form the electrodes. Revesz et al. and Dyer et al. U.S. Pat. No. 4,115,120 also disclose various conventional lift-off methods to pattern thin metal evaporated coatings and to facilitate removal of the masks employed.

Other patents of general interest include Lindmayer et al. U.S. Pat. No. 3,982,964, and Yerkes et al. U.S. Pat. Nos. 4,105,471 and 4,165,241.

In general, however, the various prior art approaches which have been, and are conventionally being used and which are described in the patents noted above, are concerned primarily with the application of relatively thin electrodes which may, or may not, comprise fine-line electrodes—i.e., electrodes on the order of less than 1.0 mils in width—but, which are generally quite thin, being measured in angstroms rather than in mils. In such thin electrodes, the problem of spreading of the electrode materials as the electrode is formed has simply not been faced.

SUMMARY OF THE INVENTION

Accordingly, it is a general aim of the present invention to provide improved light transducers such, for example, as solar cells—especially, concentrator solar cells—and improved methods for manufacture thereof, which overcome the foregoing disadvantages inherent in the formation of electroplated electrodes; and, which permit the formation of relatively thick electrodes, preferably on the order of 0.7 mils in thickness of greater, while maintaining relatively fine-line electrode geometries—i.e., electrodes which are on the order of less than 1.0 mils in width and preferably, less than 0.7 mils in width—with the electrodes characterized by their relatively sharp, steep, vertical edge profiles.

In another of its important aspects, it is an object of the invention to provide an improved process for applying relatively thick fine-line electrodes on the contact areas of concentrator solar cells and the like wherein the natural tendency of such electrodes to "spread" as the electrode thickness is built up is precluded.

A further objective of the invention is the provision of improved processes for forming fine-line electroplated electrodes on concentrator solar cells characterized by their high current carrying capacity; yet, wherein the electrodes have little or no tendency to mask the photoactive regions of the cell and wherein the exposed surface area of the cell which is covered by electrode materials is maintained at a minimum.

DESCRIPTION OF THE DRAWINGS

These and other objects and advantages of the present invention will become more readily apparent upon reading the following detailed description and upon reference to the attached drawings, in which.

Figure 1:
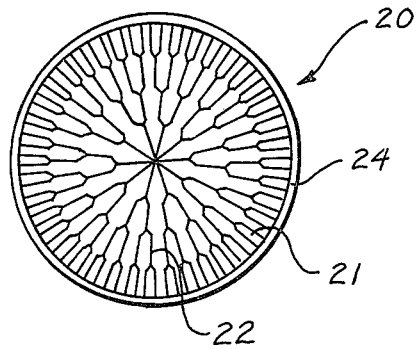
FIG. 1 is a highly diagrammatic plan view, somewhat enlarged in scale, here depicting a light transducer—e.g., a concentrator solar cell—embodying the features of the present invenion with the relatively thick, fine-line current collecting electrodes here being fragmentarily illustrated in highly exaggerated spaced from, it being understood that in actuality the electrodes would appear as relatively close spaced, fine, generaly radial lines.

While the invention is susceptible of various modifications and alternative forms, a specific embodiment thereof has been shown by way of example in the drawings and will herein be described in detail. It should be understood, however, that it is not intended to limit the invention to the particular form disclosed but, on the contrary, the intention is to cover all modifications, equivalents, and alternatives falling within the spirit and scope of the invention as expressed in the appended claims.

DETAILED DESCRIPTION

Turning now to FIG. 1, an exemplary concentrator solar cell, generally indicated at 20, embodying the features of the present invention has been diagrammatically illustrated. As here shown, the cell 20 (which, in actual size, might commonly be on the order of approximately 2.0" in diameter) comprises a photoactive, light absorbing, current generating surface 21 formed on a suitable wafer-like semiconductor substrate such, for example, as silicon and upon which are formed a plurality of generally radial, fine-line electrodes 22 and a peripherally disposed current collecting electrode 24. Conventionally, the wafer-like semiconductor substrate may range in thickness from, for example, 125 μm to 400 μm. A somewhat structurally modified, but functionally identical, exemplary concentrator solar cell, generally indicated at 25, has been illustrated in FIG. 2. In this instance, the cell 25 actually comprises a pair of generally rectangular, electrically independent cells 25a and 25b (which each might conventionally be on the order of approximately 1"×0.375") having photoactive, light absorbing, current generating surfaces 26 upon which are formed a plurality of closely spaced, parallel, fine-line electrodes 28 and a current collecting electrode 28. As here shown, the parallel electrodes 28 for the two independent solar cells segments 25a, 25b extend towards, but terminate short of, one another; thus permitting the cell segments 25a, 25b to be physically separated along a centrally disposed score line (not shown) formed in the substrate of the cell 25.

Figure 2:
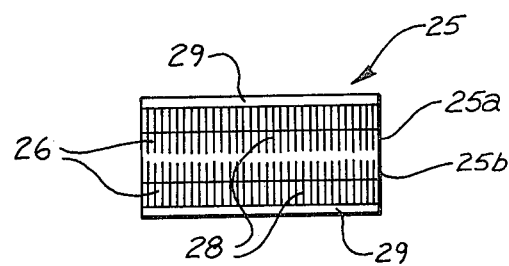
FIG. 2 is a plan view similar to FIG. 1, but here illustrating a modified type of concentrator solar cell—indeed, two separate, independent solar cells formed on a single substrate with each cell having a generally rectangular configuration and a plurality of parallel, closely spaced, fine-line electrodes each formed in accordance with the present invention.

Those skilled in the art will readily appreciate that solar cells such as the exemplary solar cells 20, 25, as thus far briefly described, are quite conventional; at least insofar as the physical arrangement of the exemplary electrode layouts on photoactive surfaces are concerned. Of course, the electrodes as physically illustrated in both FIGS. 1 and 2 are shown in considerably exaggerated form for purposes of clarity and would commonly comprise extremely fine-line, vacuum deposited electrodes on the order of less than 1.0 mils in width; with such electrodes being spaced apart by discrete exposed photoactive regions 21 about ten times the width of the electrodes—viz, from 5.0 mils, or less, to about ten times the width of the electrodes—viz, from 5.0 mils to 10.0 mils, on average. That is, in the design of concentrator solar cells of the type here illustrated, it is highly desirable to maximize the amount of cell area comprising exposed photoactive material so as to maximize light absorption and current generation. On the other hand, it is essential that sufficient electrode area be provided to permit collection and conduction of generated current. Consequently, optimized relative percentages of electrode area and photoactive area may vary from cell to cell dependent upon the specific application(s) to which the cell is to be put; but, with concentrator solar cells of the type here illustrated by way of example, it is not unusual to encounter arrangements wherein, on average, approximately 90% of the total cell surface area comprises exposed photoactive regions, with the remaining 10% of the cell area being "masked" from incident radiation by vacuum deposited, fine-line electrodes. Those skilled in the art will, therefore, appreciate that the problem of "spreading" of electroplated metallic electrodes can produce a significant decrease in the percentage of total cell surface area which comprises exposed photoactive regions since, where one attempts to form electroplated electrodes on the order of 0.7 mils to about 1.0 mils, or greater, in thickness (as contrasted with conventional electrodes which range in thickness from only a few thousand angstroms to several thousand angstroms), the net result of the spreading phenomenon is to effectively double the percentage of cell area that is "masked" by the electrodes from incident radiation to, on average, perhaps 20% of the total cell area, thereby reducing the exposed photoactive area of the cell from approximately 90% to only 80%.

Figure 3:
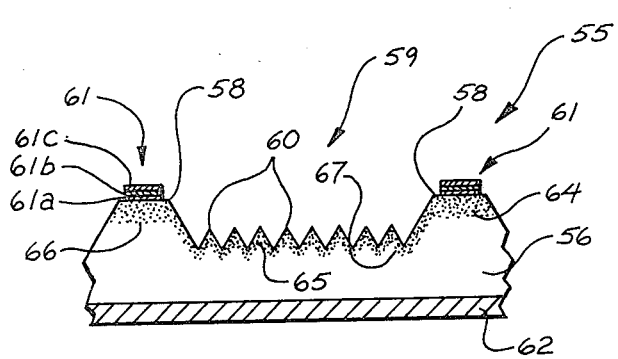
FIG. 3 is a fragmentary sectional view here illustrating in highly diagrammatic form, a partially processed concentrator solar cell substrate which is particularly suitable for use in accordance with the present invention and having relatively thin, vacuum deposited, fine-line electrodes formed on the contact areas preparatory to formation of relatively thick electroplated electrodes in accordance with the invention.

Turning next to FIG. 3, there has been illustrated an exemplary concentrator solar cell 55 of the type more fully described in the aforesaid copending application of Billy J. Stanbery, Ser. No. 169,790, filed July 17, 1980, and assigned to the assignee of the present invention; such cell here being illustrated at an intermediate step in the manufacturing process of the present invention—viz, following application of relatively thin, fine-line, vacuum deposited electrodes to the surface of the contact areas of the substrate. Thus, as here shown, the exemplary concentrator solar cell 55 comprises a wafer-like semiconductor substrate 56 which can be either a p-type or an n-type substrate having a plurality of raised, spaced, mesa-like contact areas 58 and intermediate photoactive areas, generally indicated at 59, which have preferably been texturized to form a multiplicity of closely spaced, randomly located, randomly sized, minute pyramids 60. While such pyramids are randomly sized, they are, on average, about 10 μm in height. The contact areas 58 are preferably raised mesa-like areas dimensioned to accommodate deposition of fine-line electrodes 61—e.g., electrodes on the order of less than about 1.0 mils in width—by means of conventional high resolution photolithographic techniques. A back electrode 62 is applied to the surface of the substrate 56 remote from the photoactive surface 59 and the fine-line electrodes 61. As here shown, such fine-line electrodes 61 preferably comprise a first vacuum deposited layer 61a of titanium on the order of 500 Å in thickness, an intermediate layer 61b of palladium on the order of 500 Å in thickness, and an upper layer 61c of silver on the order of 1000 Å in thickness, will all of such layers having been deposited thereon by completely conventional vacuum depositions techniques.

As described in greater detail in the aforesaid copending application of Billy J. Stanbery, the illustrative concentrator solar cell is preferably formed with: (i), a relatively deep impurity atom dispersion layer 64 in the contact areas 58; and (ii), a relatively shallow impurity atom dispersion layer 65 in the interelectrode photoactive regions 59 of the cell. Preferably such shallow impurity atom dispersion layer 65 is of essentially uniform depth throughout the entire photoactive region 59 notwithstanding the presence of a highly irregular texturized surface defined by a multiplicity of minute, different sized pyramids 60; such shallow layer 65 preferably being on the order of about 0.3 μm±0.1 μm. The deep impurity atom dispersion layer 64 is preferably on the order of 0.5 μm, or greater in depth. Those skilled in the art will, of course, readily appreciate that where the substrate 56 comprises an n-type substrate, a p-type dopant such, for example, as boron would be employed; and, hence the impurity atom dispersion layers 64, 65 would comprise p+ layers defining a deep p+-n junction 66 at the interface between the layer 64 and the substrate 56 and a shallow p+-n junction 67 at the interface between the layer 65 and the substrate. Conversely, in those instances where the substrate 56 comprises a p-type silicon substrate or the like, an n-type dopant such, for example, as phosphorous would be employed; and, hence the layers 64, 65 would comprise n+ layers defining n+-p junctions 66, 67 at the interfaces between the layers 64, 65, respectively, and the substrate 56. Those interested in greater details concerning the formation of solar cells of the type illustrated in FIG. 3 are referred to the aforesaid copending application of Billy J. Stanbery since an understanding of such further details is not necessary for an understanding of the present invention.

Figure 4:
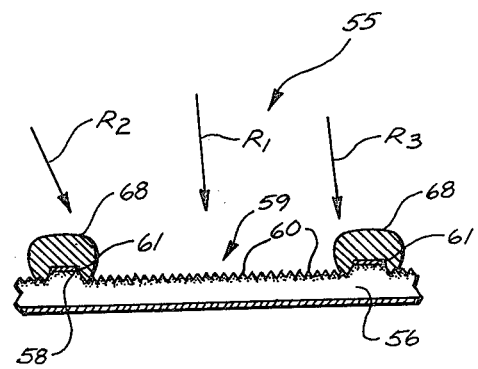
FIG. 4 is a fragmentary, highly diagrammatic sectional view (with dimensional relationships depicted in exaggerated and dimensionally disproportionate form for purposes of clarity), here illustrating the "spreading" phenomenon which characterizes conventional electroplating processes and, illustrating particularly how such spreading tends to mask the photoactive regions of the cell from incident radiation, thereby decreasing the light collection and light-to-electrical energy conversion efficiencies of the cell.

Referring next to FIG. 4 and, keeping in mind that the various components of the concentrator solar cell there shown are illustrated in highly exaggerated and dimensionally disproportionate form, the problem of "spreading" of the electrode during conventional electroplating processes may be better understood. It must, however, be kept in mind upon reference to FIG. 4 as the ensuing description proceeds that the illustrative solar cell 55 there depicted includes a substrate 56 which is only on the order of 125 μm to 400 μm in thickness, having a texturized photoactive surface 59 defined by pyramids on the order of only 10 μm in height and vacuum deposited electrodes 61 formed on the contact areas 58 wherein the multiple layers of the vacuum deposited electrodes aggregate only about 2000 Å in thickness. On the other hand, the width of the vacuum deposited electrode 61 as here shown would generally be on the order of less than about 1.0 mils and, preferably, less than 0.7 mils; with the spacing between adjacent contact areas 58 being on the order of from 5.0 mils, or less, to 10.0 mils and, preferably, to only 7.0 mils. With those dimensional relationships in mind, it will be noted that when one attempts to build up the thickness of the electrodes by electroplating additional electrode materials—say, for example, silver—on top of the thin, vacuum deposited, laminated electrode 61 to form an electrode 68 on the order of 1.0 mil in thickness by utilizing a conventional electroplating process, the net result is that the electrodeposited silver (or other conductive metal) spreads to produce an electrode 68 which is on the order of twice as wide as it is high. Consequently, the sides of the electrodes 68 tend to bulge out over the photoactive regions 59 of the photocell 55 with the net result that while incident light radiation moving along a path such as indicated by the arrow $R_1$ is free to interact with the photoactive regions, other incident radiation moving along the paths indicated by the arrows $R_2$ and/or $R_3$ is precluded from reaching the photoactive area, thereby decreasing the overall efficiency of the cell.

Figure 5A:
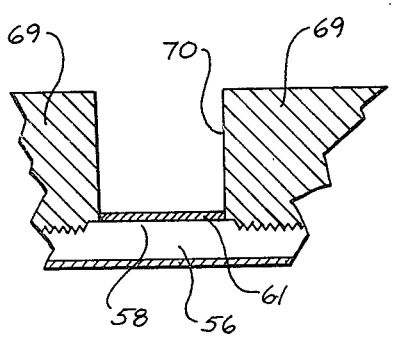
FIGS. 5A and 5B are fragmentary sectional views here illustrating two successive steps in a process embodying the features of the present invention for applying relatively thick electroplated electrodes on the contact areas of a photocell with such electrodes having a width on the order of 1.0 mils or, preferably, less, and a thickness at least as great as the width thereof and, preferably, on the order of at least 0.7 mils—FIG. 5A illustrating the substrate following lamination, exposure and development of a dry-film photoresist laminate on the order of at least 0.7 mils in thickness, and FIG. 5B illustrating the substrate following the application of a relatively thick electroplated electrode thereon.

In accordance with one of the important aspects of the present invention, provision is made for increasing the thickness of current conducting electrodes having fine-line geometry and of the type formed on the contact areas 58—preferably, on slightly raised mesa-like contact areas 58—of concentrator solar cells 55 of the type depicted in FIG. 3 by means of an electroplating technique; yet, wherein the electroplated metals are prevented from spreading and, rather, are deposited within exposed and developed, precisely located, well defined windows or openings formed in a suitable photoresist mask which is on the order of 0.7 mils, or greater, in thickness. To this end, and referring first to FIG. 5A, this is accomplished by laminating the cell substrate 56 (after formation of the contact areas 58 and the n+-p or p+-n junctions 66, 67, and vacuum deposition of the thin, fine-line, electrodes 61 on the contact areas 58) to a suitable photoresist mask 69 which may take any commercially available form but, which preferably comprises a positive dry-film photoresist laminate on the order of 0.7 mils, or greater, in thickness.

Figure 5B:
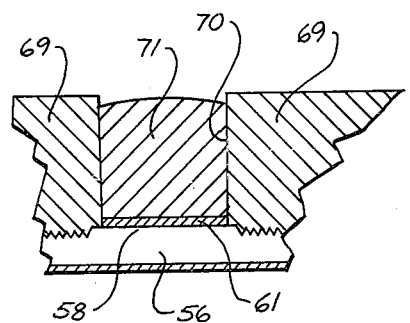
Figure 6:
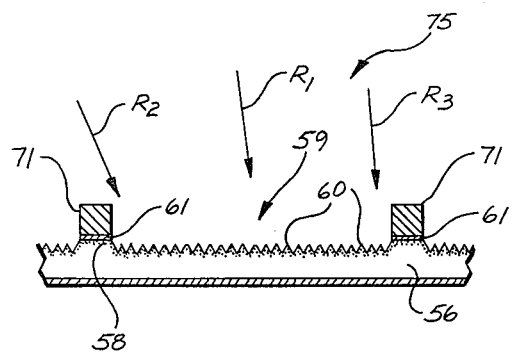
FIG. 6 is a fragmentary sectional view somewhat similar to FIG. 3, but here illustrating a concentrator solar cell made in accordance with the present invention following application of an electroplated electrode on the previously formed vacuum deposited electrode with such electroplated electrode being characterized by its sharp, steep, well-defined vertical edge profiles, it being understood that the dimensional relationships depicted have again been shown in greatly exaggerated and dimensionally disproportionate form for purposes of clarity.

Following lamination of the thus prepared substrate 56 and photoresist mask, the laminated wafers are cut from the continuous film laminate, baked and cooled. Thereafter, the substrate/photoresist laminate is subjected to a conventional photolithographic process to expose and develop the grid-like electrode pattern (Cf., FIGS. 1 and 2, for example) in the surface of the photoresist laminate 69, thereby forming precisely located windows or openings 70 in the photoresist mask 69 corresponding to the grid-like electrode pattern and in registration with the raised mesa-like contact pattern formed on the substrate; such openings having generally vertical, well-defined edge contours. Thereafter, and as best illustrated in FIG. 5B, the masked developed substrate is subjected to a conventional electroplating process, preferably utilizing a plating solution of pure silver, to form a plated electrode 71 directly on top of the previously formed vacuum deposited, thin ($\simeq$2000 Å) three-laminate electrode 61 formed on the contact areas 58. Such electroplated electrode 71 is on the order of less than about 1.0 mils and, preferably, less than 0.7 mils, in width and at least as thick as it is wide—i.e., it is preferably 0.7 mils, or greater, in thickness—and, because of the presence of the thick photoresist mask 69 having well-defined windows or openings 70 formed therein, the sides of the electroplated electrodes 71 are well-defined, sharp and vertically oriented throughout the height of the opening 70 in the photoresist mask 69. The photoresist mask 69 is then removed in any conventional manner, thus forming a completed solar cell embodying the features of, and made in accordance with, the present invention, as best illustrated at 75 in FIG. 6.

Those skilled in the art will readily appreciate that the substrate 56, the junctions 66, 67 formed therein, and the particular grid patterns employed for the electrodes 71, may all vary widely dependent upon the particular application(s) to which the cell is to be put and other numerous design considerations involved. Moreover, the particular processes employed in preparation of the substrate prior to application of a relatively thick laminated photoresist mask 69 are not critical to the present invention. For example, although it is preferable to form thin, vacuum deposited electrode layers 61a–61c (FIG. 3) of titanium, palladium and silver on the contact areas 58 in the manner previously described, other techniques and/or materials can be used without departing from the spirit and scope of the invention, such, for example, as electroless plating techniques or the like. Generally, however, it has been found that excellent results can be attained by first forming a substrate having raised mesa-like contact areas 58 and both deep and shallow junctions formed in a double or multiple-step impurity atom dispersion process of the type described more fully in the aforesaid copending application of Billy J. Stanbery. Thereafter, a thin, conventional, photoresist mask (not shown) is preferably applied to the substrate 56 by well known spinning techniques; with the mask then being exposed and developed by conventional photolithographic techniques prior to vacuum deposition of the titanium/palladium/silver laminates for the thin (≅2000 Å) laminated electrode 61. The thin photoresist mask is then removed in a conventional manner—for example, by the use of acetone. At this point, the thus prepared concentrator solar cell substrate 56 is in readiness for electroplating in accordance with the invention.

Prior to lamination of the dry-film photoresist laminate 69, it has been found desirable to first bake the wafer-like substrates 56 for about ten minutes at a temperature on the order of 255° F. After cooling, the wafers are deposited on a suitable mylar backing sheet or the like. The backing sheet, with the wafer-like substrates positioned thereon, is fed, together with an overlying continuous dry-film photoresist laminate, through a conventional laminating apparatus (not shown), where the laminating roll temperature is preferably maintained at about 265°±5° F., at a feed rate on the order of 1 ft./min. The thus laminated substrates and photoresist laminate 69 are then cut from the continuous dry-film laminate, separated from one another, and the protective film (not shown) conventionally forming the upper surface of the photoresist laminate is removed. Although we have found that particularly advantageous results are attained when using a dry-film photoresist laminate—preferably a positive photoresist—other photoresist materials may be used including liquid photoresist materials provided that the photoresist layer is on the order of 0.7 mils, or greater, in thickness.

At this point, the substrate/photoresist laminate is preferably pre-baked at 185° F. for about 20 minutes. The laminate is then cooled and allowed to sit for a minimum of 30 minutes prior to exposure to form a grid pattern thereon which is precisely registered with the underlying raised, mesa-like contact areas 58. At this point, the substrate/photoresist laminate is exposed and developed utilizing conventional photolithographic techniques. Such techniques will vary considerably dependent upon the particular equipment and process employed; but, we have found that exposure for a period on the order of 3-4 minutes and development for from 1 to 2 minutes produces excellent results; and, the windows or openings 70 (FIG. 5A) formed are characterized by precisely located, well-defined, vertical edge countours.

The thus prepared and masked substrate is now ready for electroplating utilizing conventional electroplating processes, materials and techniques. Again, however, we have found that excellent results are attained when utilizing a conventional silver cyanide plating process employing a plating solution with pure silver and which does not attack the photoresist mask 69. Once plating is complete, the photoresist mask 69 is removed. One advantage to the present process is that it has been found that no further hard bake is required following exposure and development; although with conventional photoresist processes such a final hard bake is commonly required and/or employed.

Figure 7:
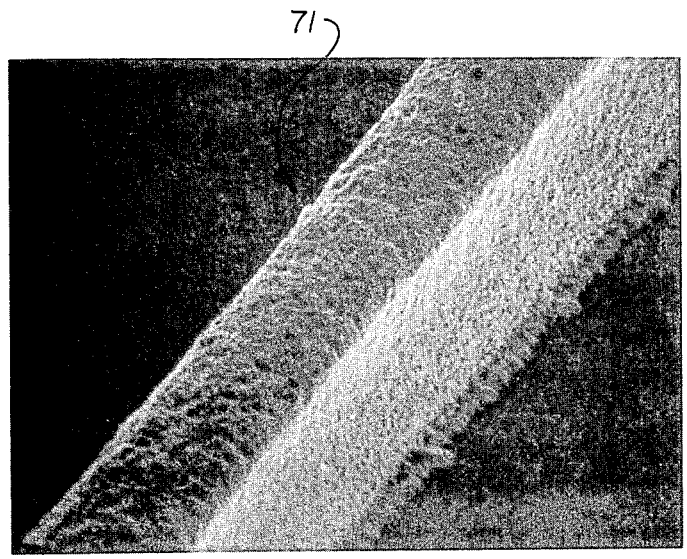
FIG. 7 is a highly magnified (2000X) microphotograph of a portion of the solar cell shown in FIG. 1, here taken at an approximate 45° oblique angle an illustrating particularly the well-defined sharp vertical edge of the relatively thick electroplated electrode produced in accordance with the invention; and, FIG. 8 is a graphic representation illustrating particularly the comparative efficiencies at differing concentration ratios (Suns) of two different, but generally comparable, concentrator solar cells employing fine-line electrode geometries with one cell employing conventional electroplated electrodes and the second cell employing electroplated electrodes formed in accordance with the present invention, with efficiency being illustrated on the ordinate and concentration ratios (Suns) on the abscissa.
Figure 8:
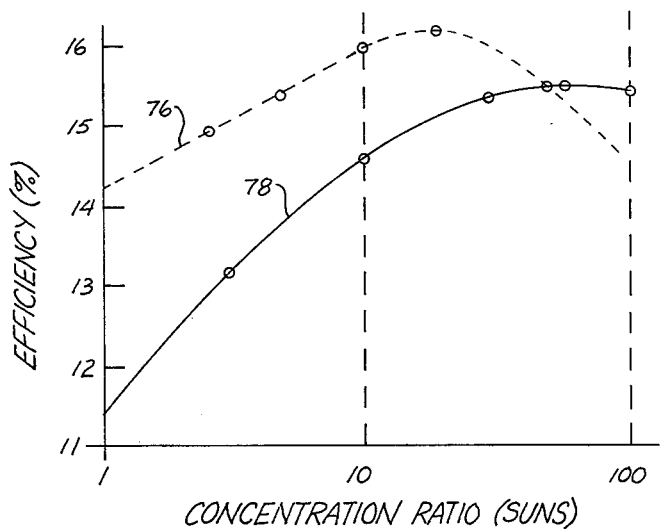

Reference to FIG. 7, a highly enlarged (2000X) microphotographic reproduction of an electrode 71 formed in accordance with the present invention, readily reveals the sharp, well-defined, verically oriented edge contours that result. Such an electrode has been found to have extremely high current-carrying capacity compatible with the present state-of-the-art concentrator solar cell technology in terms of high collection efficiencies and high light-to-electrical energy conversion efficiencies that are presently attainable in the art. Moreover, it has been found that concentrator solar cells made in accordance with the present invention exhibit considerably improved efficiency characteristics at higher concentration ratios (Suns). Thus, referring to FIG. 8, it will be noted that a conventional photocell exhibits an efficiency rating (as indicated by the curve 76) which varies from about 14% to about 16% at concentration ratios of 20 Suns and less; but, thereafter, the efficiency of a conventional cell drops rapidly to about 14% at 100 Suns. Concentrator solar cells made in accordance with the present invention, however, tend to show increasing efficiency levels to a point somewhat above 20 Suns and, thereafter, the efficiency profile remains stable to 100 Suns and above with efficiencies ranging from between 15% to 16% based upon the test data reported to date, as indicated by the curve 78 in FIG. 8. While it is believed that maximum attainable efficiencies have not actually been reached thus far when manufacturing concentrator solar cells in accordance with the invention, it has been noted that considerably higher efficiency levels can be routinely achieved and maintained with those concentrator solar cells made in accordance with the invention and which are intended to operate at concentration ratios on the order of 100 Suns or greater.

What is claimed is:

1. The method of forming a highly efficient concentrator solar cell or the like having fine-line current carrying electrodes formed on a surface thereof with such electrodes having a width on the order of less than about 1.0 mils and a minimum thickness at least equal to the width thereof, comprising the steps of:
   (a) preparing a semiconductor substrate having at least one impurity dispersion zone formed on one surface thereof and a fine-line, grid-like contact area pattern formed thereon with such fine-line, grid-like pattern defined by contact areas of on the order of less than about 1.0 mils in width;
   (b) laminating a photoresist mask to the semiconductor substrate formed in step (a) with such mask having a thickness at least equal to the width of the fine-line, grid-like contact areas;
   (c) exposing the mask to form a grid-like pattern thereon in registration with the fine-line, grid-like contact area pattern formed on the substrate;
   (d) developing the exposed grid-like pattern formed in step (c) to produce a grid-like pattern of openings in the mask and extending therethrough with such openings (i) being in registration with the grid-like contact area pattern, (ii) having a width on the order of less than about 1.0 mils, and (iii) having well-defined vertical edge contours with a height at least equal to the width of said openings;
   (e) applying a metallic electroplated electrode to the exposed contact areas on the substrate through the openings formed in the photoresist mask with the metallic electroplated electrode having a width on the order of less than about 1.0 mil, a thickness at least equal to the width thereof, and well-defined, sharp, vertically oriented electrode edge contours; and, (f) removing the photoresist mask laminate from the concentrator solar cell substrate.

2. The concentrator solar cell produced by the method set forth in claim 1.

3. The method of forming a highly efficient concentrator solar cell as set forth in claim 1 wherein the fine-line contact areas formed in step (a), the developed openings formed in step (c), and the electrodes formed in step (e) each have a width on the order of less than about 0.7 mil.

4. The method of forming a highly efficient concentrator solar cell as set forth in claim 1 or 3 wherein the photoresist mask is formed from dry-film photoresist material.

5. The method of forming a highly efficient concentrator solar cell as set forth in claim 1 or 3 wherein the photoresist mask is formed from positive dry-film photoresist material.

6. The method of forming a highly efficient concentrator solar cell as set forth in claim 1 or 3 wherein the photoresist mask is formed from liquid photoresist material.

7. The method of forming a highly efficient concentrator solar cell as set forth in claim 1 or 3 wherein the fine-line, grid-like contact area pattern formed in step (a) comprises a plurality of raised mesa-like contact areas.

8. The method of forming a highly efficient concentrator solar cell as set forth in claim 1 or 3 wherein a relatively thin metallic electrode is evaporated on the contact areas prior to step (b).

9. The method of forming a highly efficient concentrator solar cell as set forth in claim 1 or 3 wherein a relativly thin electrode is formed on the contact areas by vacuum deposition prior to step (b).

10. The method of forming a highly efficient concentrator solar cell as set forth in claim 1 or 3 wherein a relatively thin electrode having a thickness on the order of 2000 Å is formed on the contact areas by vacuum deposition prior to step (b).

11. The method of forming a highly efficient concentrator solar cell as set forth in claim 1 or 3 wherein a layer of electrically conductive material having a thickness on the order of 500 Å is vacuum deposited on the contact areas prior to step (b).

12. The method of forming a highly efficient concentrator solar cell as set forth in claim 1 or 3 wherein a relatively thin electrode having an aggregate thickness on the order of 2000 Å is formed on the contact areas prior to step (b) by vacuum deposition of multiple layers of conductive material thereon.

13. The method of forming a highly efficient concentrator solar cell as set forth in claim 1 or 3 wherein the metallic electrode formed in step (e) is silver.

14. The method of forming a highly efficient concentrator solar cell as set forth in claim 1 or 3 wherein the metallic electrode formed in step (e) is formed by electroplating utilizing a silver cyanide plating solution.

15. A concentrator solar cell comprising, in combination, a wafer-like semiconductor substrate, a first current carrying electrode formed on one face of said substrate, impurity dispersion layer defining means formed in the opposite face of said substrate, a grid contact pattern formed on said opposite face of said substrate, and an electroplated metallic second electrode formed on said grid contact pattern, said electrode having a width on the order of less than about 1.0 mil, a thickness at least as great as the width thereof, and well-defined, sharp vertically oriented edge contours.

16. A concentrator solar cell as set forth in claim 15 wherein said second electrode has a width on the order of less than about 0.7 mil.

17. A concentrator solar cell as set forth in claim 15 or 16 wherein said second electrode is silver.

18. A concentrator solar cell as set forth in claim 15 or 16 wherein a relatively thin evaporated metal electrode is formed on said grid contact pattern intermediate said pattern and said electroplated metallic second electrode.

19. A concentrator solar cell as set forth in claim 15 or 16 wherein a relatively thin vacuum deposited metal electrode having a thickness on the order of 2000 Å is formed on said grid contact pattern intermediate said pattern and said electroplated metallic second electrode.

20. A concentrator solar cell as set forth in claim 15 or 16 wherein a relatively thin vacuum deposited metal layer having a thickness on the order of 500 Å is formed on said grid contact pattern intermediate said pattern and said electroplated metallic second electrode.

21. A concentrator solar cell as set forth in claim 15 or 16 wherein a plurality of thin vacuum deposited metal layers each having a thickness in the range of from about 500 Å to about 1000 Å and defining a relatively thin laminar vacuum deposited electrode having an aggregate thickness on the order of 2000 Å is formed on said grid contact pattern intermediate said pattern and said electroplated metallic second electrode.

* * * * *